(12) United States Patent
Conley, Jr. et al.

(10) Patent No.: US 7,597,757 B2
(45) Date of Patent: Oct. 6, 2009

(54) ZNO FILM WITH C-AXIS ORIENTATION

(75) Inventors: John F. Conley, Jr., Camas, WA (US); Yoshi Ono, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 528 days.

(21) Appl. No.: 11/281,033

(22) Filed: Nov. 17, 2005

(65) Prior Publication Data

US 2007/0108866 A1 May 17, 2007

(51) Int. Cl.
*C30B 21/02* (2006.01)
(52) U.S. Cl. .............................. 117/84; 117/86; 117/90; 117/94; 117/95
(58) Field of Classification Search ................... 117/84, 117/86, 90, 94, 95
See application file for complete search history.

(56) References Cited

U.S. PATENT DOCUMENTS 4,501,987 A * 2/1985 Mitsuyu et al. ......... 310/313 A

OTHER PUBLICATIONS

Hu et al., "Preparation of piezoelectric coefficient modulated multilayer film ZnO/Al2O3 and its ultrahigh frequency resonance", Applied Physics Letters 71(4) Jul. 28, 1997 p. 548-50.*

* cited by examiner

*Primary Examiner*—Robert M Kunemund
(74) *Attorney, Agent, or Firm*—Law Office Of Gerald Maliszewski; Gerald Maliszewski

(57) ABSTRACT

A ZnO film with a C-axis preference is provided with a corresponding fabrication method. The method includes: forming a substrate; forming an amorphous $Al_2O_3$ film overlying the substrate; and, forming a ZnO film overlying the $Al_2O_3$ film at a substrate temperature of about 170° C., having a C-axis preference responsive to the adjacent $Al_2O_3$ film. The substrate can be a material such as Silicon (Si) (100), Si (111), Si (110), quartz, glass, plastic, or zirconia. The $Al_2O_3$ film can be deposited using a chemical vapor deposition (CVD), atomic layer deposition (ALD), or sputtering process. Typically, the $Al_2O_3$ layer has a thickness in the range of about 3 to 15 nanometers (nm). The step of forming the ZnO film having a C-axis preference typically means that the ZnO film has a (002) peak at least 5 times greater than the (100) peak, as measured by X-ray diffraction (XRD).

10 Claims, 4 Drawing Sheets

ZNO FILM WITH C-AXIS ORIENTATION

BACKGROUND OF THE INVENTION

1. Field of the Invention

This invention generally relates to integrated circuit (IC) fabrication and, more particularly, to a ZnO film formed with a C-axis orientation, as a result of an underlying amorphous $Al_2O_3$ layer.

2. Description of the Related Art

As-deposited thin film ZnO, deposited using an atomic layer deposition (ALD) process, has a low C-axis orientation and a small crystal size. It is well known that crystal-matched substrates can be employed to guide the crystallization of an overlying thin film. For example, C-axis ZnO films can be formed using epitaxy and epitaxial lateral overgrowth processes. These methods are slow, require high temperatures, and require a crystalline substrate or seed layer. It has also been reported that well-aligned vertical ZnO nanowires can be grown on crystal-matched substrates, such as sapphire or GaN. It has been reported that high C-axis, and even epitaxial, ZnO films can be grown on sapphire substrates, where a sapphire substrate is single-crystal $Al_2O_3$.

Nanostructured materials such as nanowires, nanorods, and nanoparticles, have potential for use in applications such as nanowire chemical and bio sensors, nanowire LEDs, nanowire transistors, nanowire lasers, to name a few examples. Materials such as ZnO have been made into nanostructures, when the growth is properly controlled. ZnO is a photo-luminescent (PL) material of interest that exhibits an intrinsic UV PL at 380 nanometers (nm) and a defect-related visible PL broadly centered around about 500-700 nm.

An often reported technique for incorporating nanostructures into CMOS electronics involves growing nanowires on one substrate, "harvesting" them, and then dispersing them onto the device substrate, which is often referred to as the "pick and place" method. The use of ZnO nanostructures grown directly onto the device substrate is still not widely reported. Fabrication of devices using directly grown nanowires has advantages over more conventional pick and place methods, such as cleanliness and direct placement of nanostructures. In addition to growing well-aligned vertical nanostructures, it would be advantageous if C-axis ZnO films could be fabricated without using costly epitaxial processes.

SUMMARY OF THE INVENTION

The present inventions provides a method for using an amorphous thin film $Al_2O_3$ buffer layer, to seed C-axis crystal growth in a subsequently deposited ALD ZnO thin film. When deposited on a Si substrate, ALD ZnO typically has some C-axis preference, but it is not strong. However, if a thin amorphous $Al_2O_3$ buffer layer is deposited between the ZnO and the Si substrate ($ZnO/Al_2O_3/Si$), the C-axis orientation of the overlying ZnO films is greatly enhanced. The method does not require high temperatures, a crystalline seed layer, or a special crystal matched substrate.

Accordingly, a method is provided for fabricating a ZnO film with a C-axis preference. The method comprises: forming a substrate; forming an amorphous $Al_2O_3$ film overlying the substrate; and, forming a ZnO film overlying the $Al_2O_3$ film at a substrate temperature of about 170° C., having a C-axis preference responsive to the presence of the $Al_2O_3$ film. The substrate can be a material such as Silicon (Si) (100), Si (111), Si (110), quartz, glass, plastic, or zirconia. The $Al_2O_3$ film can be deposited using a chemical vapor deposition (CVD), atomic layer deposition (ALD), or sputtering process. Typically, the $Al_2O_3$ layer has a thickness in the range of about 3 to 15 nanometers (nm).

The step of forming the ZnO film with a C-axis preference typically means that the ZnO film has a (002) peak about 5 times as large as the (100) peak, or greater, as measured by X-ray diffraction (XRD). In one aspect, the method further comprises: annealing the ZnO film at a temperature in the range of about 400 to 900° C.; and, in response to the annealing, increasing the ZnO film C-axis preference. For example, after annealing, the ZnO film can have a (002):(100) peak ratio of greater than about 100:1.

Additional details of the above-described method, and a ZnO thin film structure with a C-axis preference, are provided below.

DETAILED DESCRIPTION

Figure 1:
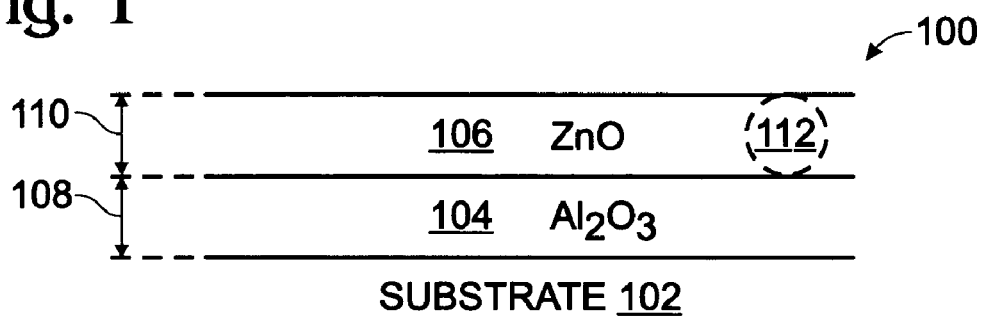
FIG. 1 is a partial cross-sectional view of a ZnO thin film structure with a C-axis preference.

FIG. 1 is a partial cross-sectional view of a ZnO thin film structure with a C-axis preference. The structure 100 comprises a substrate 102 and an amorphous $Al_2O_3$ film 104 overlying the substrate 102. A ZnO film 106 overlies the $Al_2O_3$ film 104, and has a (002) peak about 5 times as large as the (100) peak, or greater, as measured by X-ray diffraction (XRD).

Figure 2:
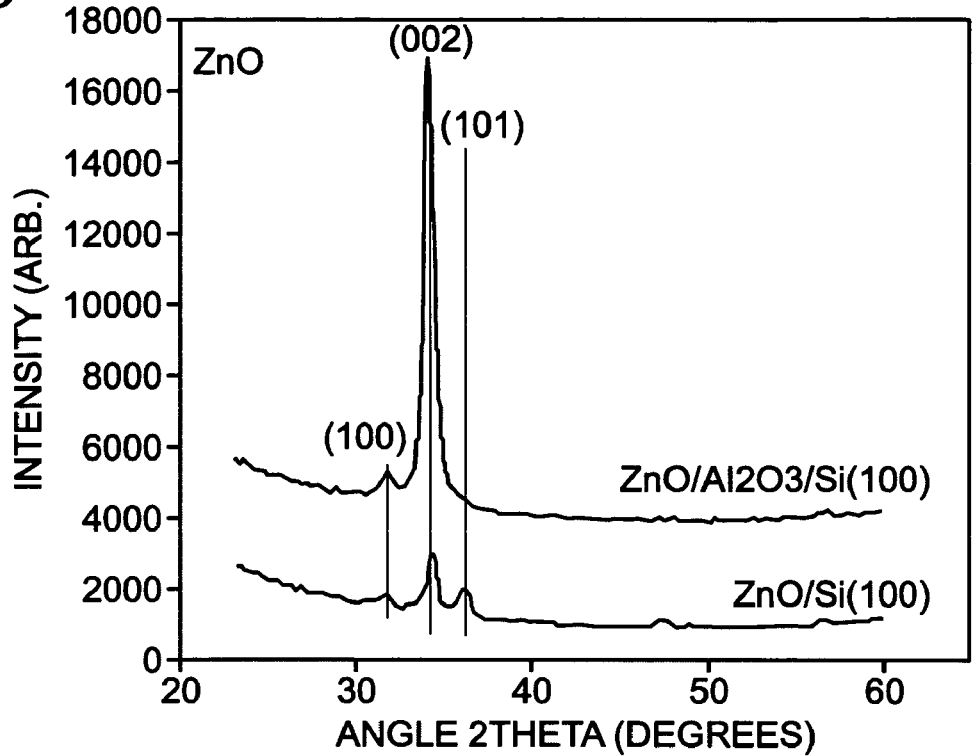
FIG. 2 is a XRD plot comparing a ZnO film formed overlying an amorphous $Al_2O_3$ film, to a ZnO film formed directly over a Si substrate.

FIG. 2 is a XRD plot comparing a ZnO film formed overlying an amorphous $Al_2O_3$ film, to a ZnO film formed directly over a Si substrate. The ZnO/Al2O3/Si(100) structure shows that the (002) peak is about 5 times greater than the (100) peak. The traces in this figure are offset by a constant, to improve legibility. The peak heights are not measured from the origin (zero), but rather from a baseline offset. Measured from the baseline, the bottom trace has a (002):(100) ratio of roughly 7.5:2.5 or 3:1, while the top trace has a ratio of roughly 56:4 or 14:1. So in this case, the relative improvement in the ratio is 14/3 or about 4.7×. In other samples (not shown here) the improvement is even better. Therefore, as compared to the ZnO film without the underlying $Al_2O_3$ film, the C-axis orientation of ZnO/$Al_2O_3$/Si(100) structure is more than about 5 times as great, as measured using the (002) peak.

Returning to FIG. 1, the substrate 102 can be a material such as Si (100), Si (111), Si (110), quartz, glass, plastic, or zirconia, to name a few examples. The amorphous $Al_2O_3$ film 104 has a thickness 108 in the range of about 3 to 15 nanometers (nm). In some aspects, the ZnO film 106 has a thickness 110 in the range of about 3 to 300 nm.

Figure 5:
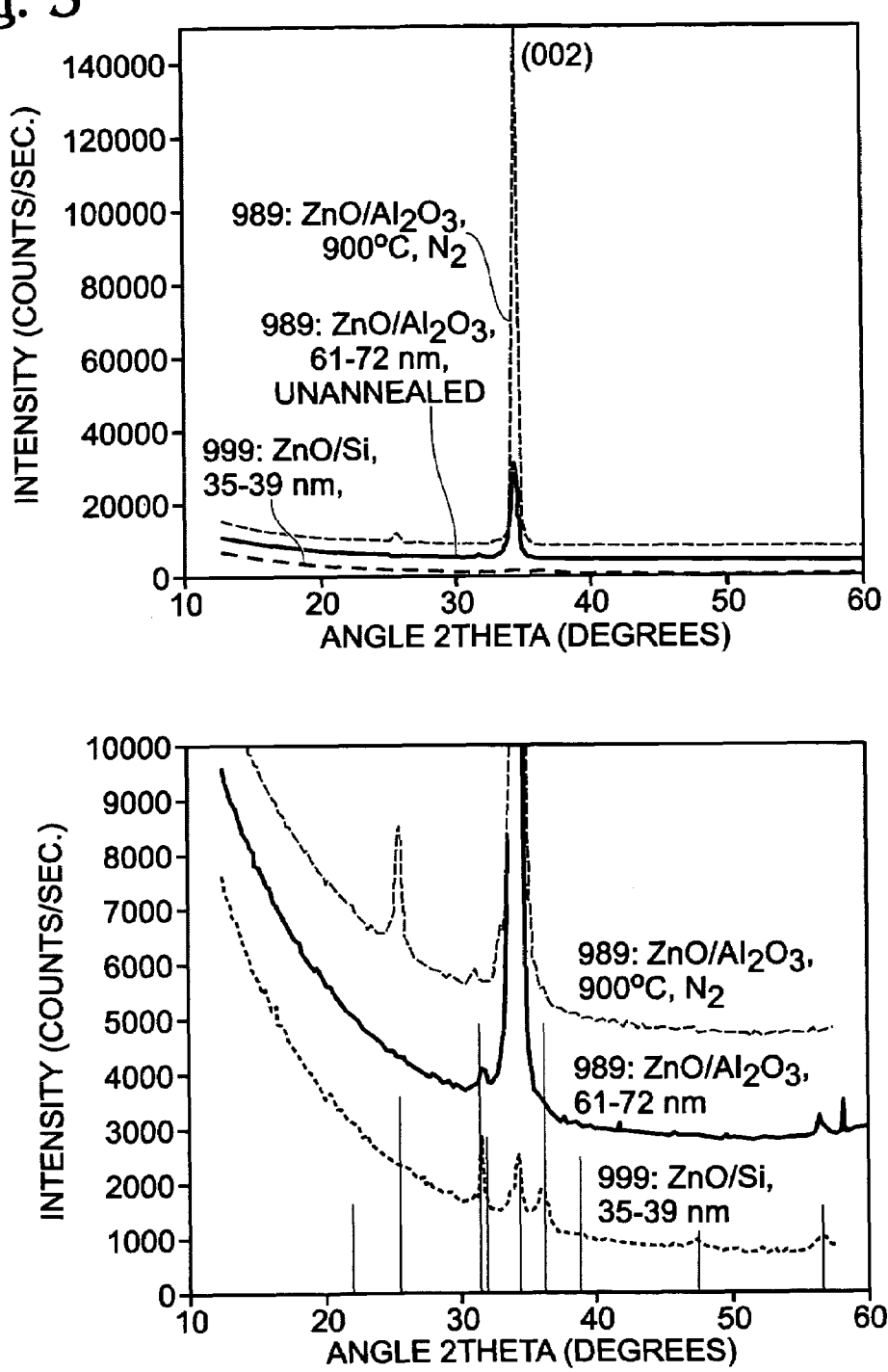
FIG. 5 is an XRD 2theta—omega plot comparing the (002) peaks of ZnO films formed in different processes.

If annealed, the ZnO film 106 can have a (002):(100) peak ratio of greater than about 100:1. As shown in FIG. 5 and explained below, as-deposited Si has a ratio of 2.6:1. As-deposited $Al_2O_3$/Si has a ratio of 50:1. After annealing the $Al_2O_3$ at 900° C., the ratio improves to about 250:1. The relative improvement associated with using an $Al_2O_3$ film is about 50/2.6, or about 19×. As compared to the as-deposited film, the annealed film shows a 100× improvement. In this aspect, the crystal grains in the ZnO film, as represented by reference designator 112, have a maximum size (diameter) about as large as the ZnO film thickness 108.

FUNCTIONAL DESCRIPTION

Figure 3:
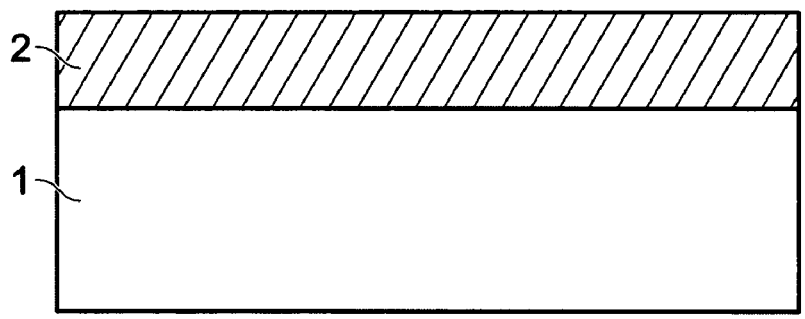
FIG. 3 is a partial cross-sectional view of ZnO film formed directly overlying a Si substrate.

FIG. 3 is a partial cross-sectional view of ZnO film 2 formed directly overlying a Si substrate 1.

Figure 4:
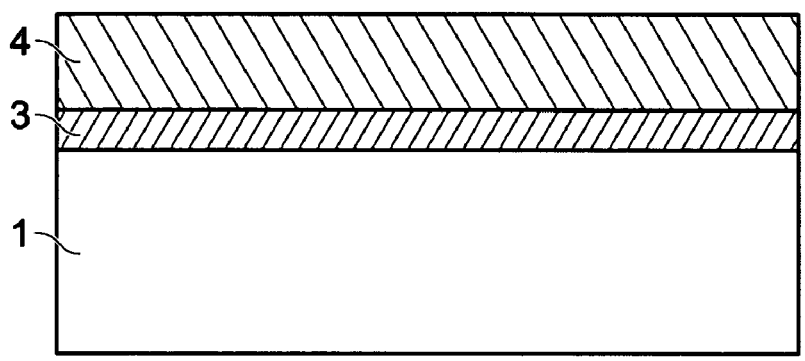
FIG. 4 is a partial cross-sectional view of ZnO film formed with an amorphous $Al_2O_3$ film directly overlying a Si substrate.

FIG. 4 is a partial cross-sectional view of ZnO film 4 formed with an amorphous $Al_2O_3$ film 3 directly overlying a Si substrate 1. The structures of FIGS. 3 and 4 have been compared using XRD, to show the poor crystallite orientation of the ZnO thin film of FIG. 3, as compared to the structure of FIG. 4. First, an approximately 6 nm $Al_2O_3$ film 3 (deposited at 175° C. via ALD) is deposited on a Si substrate 1. The exact thickness is not necessarily critical. Other deposition methods, such as CVD or sputtering, may also be used. An $Al_2O_3$ thickness range of about 3-15 nm can be used.

Next, a ZnO 4 film with a thickness of approximately 61-72 nm is deposited at 175° C., using ALD. In other aspects, any thickness of ZnO can be used.

FIG. 5 is an XRD 2theta—omega plot comparing the (002) peaks of ZnO films formed in different processes. ZnO deposited on $Al_2O_3$ (989) has a much larger (002) peak than the ZnO film deposited on a bare Si (100) surface (999), indicating a much higher C-axis preferred orientation. Subsequent annealing of the stack structure at 900° C. in $N_2$ results in an even larger increase in the (002) peak, indicating a further increase in C-axis preference. The use of a simple Sherrer analysis indicates crystal sizes in the range of 64-100 nm for the post-annealed ZnO film with the $Al_2O_3$ buffer. No peaks attributable to crystalline $Al_2O_3$ are detected, indicating that, even though the $Al_2O_3$ buffer layer is amorphous and remains so after the anneal, it still serves to greatly increase the C-axis preference of the overlying ZnO film.

Figure 6:
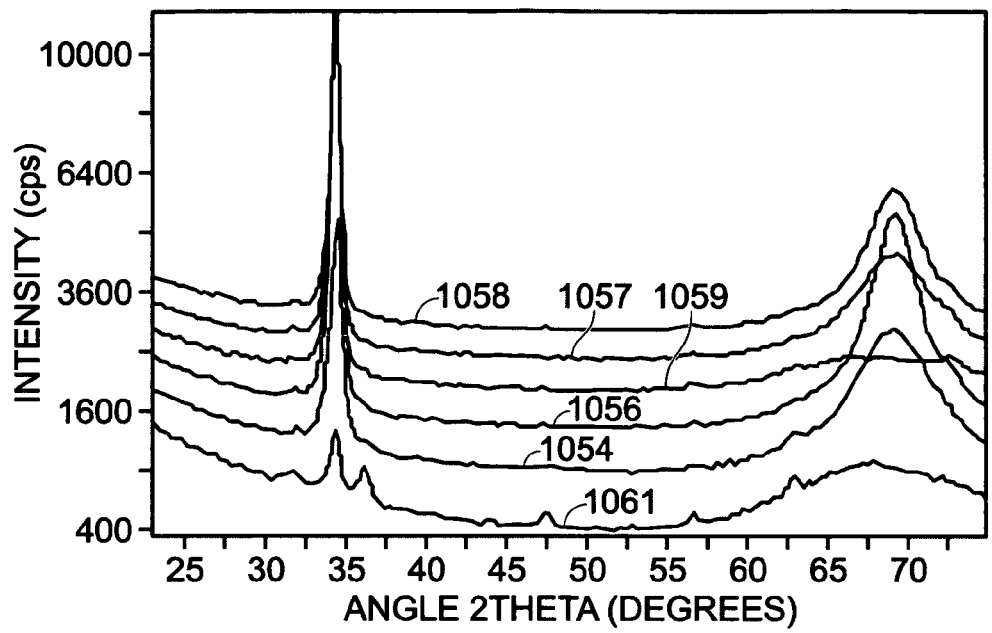
FIG. 6 is an XRD plot for ZnO films deposited on $Al_2O_3$ buffer layers of varying thicknesses.

FIG. 6 is an XRD plot for ZnO films deposited on $Al_2O_3$ buffer layers of varying thicknesses. Shown are XRD results for ALD ZnO films deposited on $Al_2O_3$ buffer layers with thicknesses of 3, 5, and 15 nm, see the accompanying Table. It can be seen that sample 1056 (buffer layer thickness=5 nm) appears to have the largest (002) peak or highest C-axis preference. Improvements as compared to bare Si (no $Al_2O_3$ buffer) are also seen for the 3 nm and 15 nm $Al_2O_3$ buffer layers (1057 and 1058). An improvement in the C-axis orientation of ZnO occurs even at the low deposition temperature (~175° C.) used for ALD.

Figure 7:
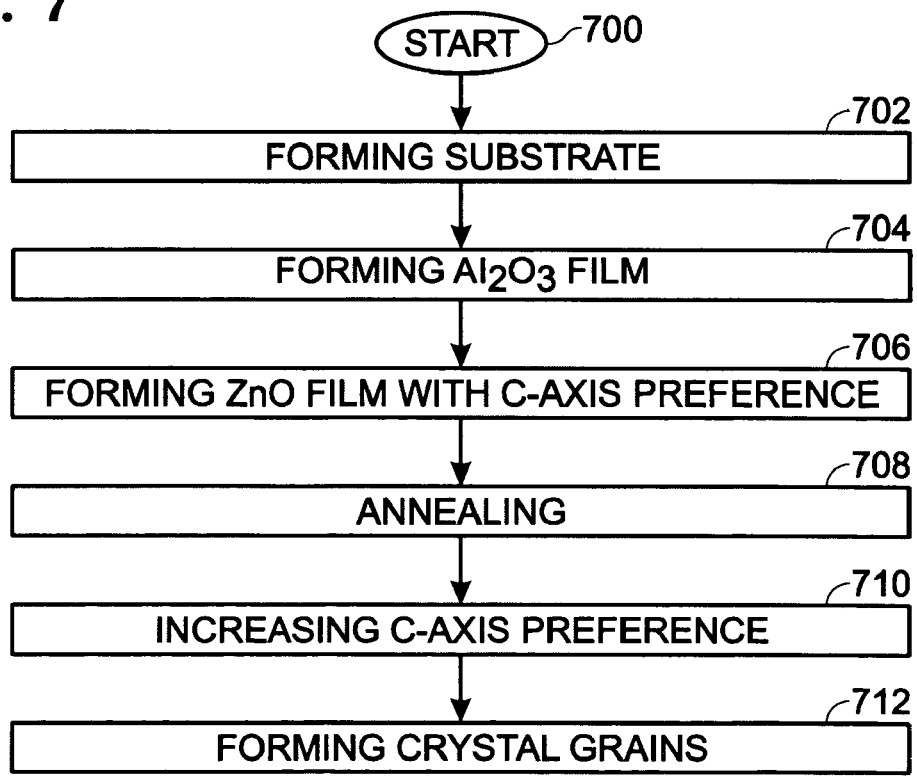
FIG. 7 is a flowchart illustrating a method for fabricating a ZnO film with a C-axis preference.

FIG. 7 is a flowchart illustrating a method for fabricating a ZnO film with a C-axis preference. Although the method is depicted as a sequence of numbered steps for clarity, the ordering of the steps does not necessarily follow the numbering. It should be understood that some of these steps may be skipped, performed in parallel, or performed without the requirement of maintaining a strict order of sequence. Some details of the method may be better understood in context of the explanations of FIGS. 1-6, above. The method starts at Step 700.

Step 702 forms a substrate. The substrate can be Si (100), Si (111), Si (110), quartz, glass, plastic, or zirconia. However, other materials are also possible. Step 704 forms an amorphous $Al_2O_3$ film overlying the substrate. Step 706 forms a ZnO film overlying the $Al_2O_3$ film at a substrate temperature of about 170° C., having a C-axis preference responsive to the presence of the $Al_2O_3$ film.

Forming the amorphous $Al_2O_3$ film overlying the substrate in Step 704 includes depositing the $Al_2O_3$ film using a deposition process such as CVD, ALD, or sputtering. If the ALD process is used, in one aspect amorphous $Al_2O_3$ film is formed overlying the substrate using a trimethylaluminum (TMA) and water precursor, at a substrate temperature of about 170° C. In another aspect, Step 704 forms an amorphous $Al_2O_3$ film having a thickness in the range of about 3 to 15 nm.

Forming the ZnO film with a C-axis preference in Step 706 may include forming a ZnO film with a (002) peak about 5 times as large as the (100) peak, or greater, as measured by XRD.

In a different aspect, Step 708 anneals the ZnO film at a temperature in the range of about 400 to 900° C., and Step 710 increases the ZnO film C-axis preference in response to the annealing. For example, increasing the ZnO film C-axis preference in Step 710 may include forming a ZnO film with a (002):(100) peak ratio of greater than about 100:1. Further, Step 712 may form crystal grains in the ZnO film having a maximum size about as large as the ZnO film thickness, in response to the annealing of Step 708.

In one aspect, forming the ZnO film in Step 706 includes forming the ZnO film from an ALD process using diethylzinc (DEZ) and water. In another aspect, Step 706 forms the ZnO film with a thickness in the range of about 3 to 300 nm. In a different aspect, Step 706 forms the ZnO film at a substrate temperature in the range of about 160 to 180° C.

A ZnO film with a C-axis preference has been provided along with a corresponding fabrication process. Specific materials and fabrication details have been given as examples to help illustrate the invention. However, the invention is not limited to merely these examples. Other variations and embodiments of the invention will occur to those skilled in the art.

We claim:

1. A method for fabricating a ZnO film with a C-axis preference, the method comprising:
    forming a substrate;
    forming an amorphous $Al_2O_3$ film overlying the substrate;
    forming a ZnO film overlying the $Al_2O_3$ film from an ALD process using diethylzinc (DEZ) and water, at a substrate temperature of about 170° C., having a C-axis preference responsive to the presence of the $Al_2O_3$ film;
    subsequent to forming the ZnO film, annealing the ZnO film at a temperature in the range of about 400 to 900° C.; and,
    in response to the annealing, increasing the ZnO film C-axis preference.

2. The method of claim 1 wherein forming the substrate includes forming a substrate from a material selected from the group consisting of Silicon (Si) (100), Si (111), Si (110), quartz, glass, plastic, and zirconia.

3. The method of claim 1 wherein forming the amorphous $Al_2O_3$ film overlying the substrate includes depositing the $Al_2O_3$ film using a deposition process selected from the group consisting of chemical vapor deposition (CVD), atomic layer deposition (ALD), and sputtering.

4. The method of claim 1 wherein forming the amorphous $Al_2O_3$ film overlying the substrate includes depositing $Al_2O_3$ using an ALD process with a trimethylaluminum (TMA) and water precursor, at a substrate temperature of about 170° C.

5. The method of claim 1 wherein forming the amorphous $Al_2O_3$ film overlying the substrate includes forming an $Al_2O_3$ layer having a thickness in the range of about 3 to 15 nanometers (nm).

6. The method of claim 1 wherein forming the ZnO film having a C-axis preference includes forming a ZnO film with a (002) peak about 5 times as large as the (100) peak, or greater, as measured by X-ray diffraction (XRD).

7. The method of claim 1 wherein increasing the ZnO film C-axis preference includes forming a ZnO film with a (002): (100) peak ratio of greater than about 100:1.

8. The method of claim 1 wherein forming the ZnO film includes forming a ZnO film with a thickness; and, the method further comprising:
in response to the annealing, forming crystal grains in the ZnO film having a maximum size about as large as the ZnO film thickness.

9. The method of claim 1 wherein forming the ZnO film includes forming the ZnO film with a thickness in the range of about 3 to 300 nanometers (nm).

10. The method of claim 1 wherein forming the ZnO film at a substrate temperature of about 170° C. includes forming the ZnO film at a substrate temperature in the range of about 160 to 180° C.

* * * * *